United States Patent [19]
Cambou et al.

[11] Patent Number: 5,281,834
[45] Date of Patent: Jan. 25, 1994

[54] NON-SILICON AND SILICON BONDED STRUCTURE AND METHOD OF MANUFACTURE

[75] Inventors: Bertrand F. Cambou, Mesa; H. Ming Liaw; Mamoru Tomozane, both of Scottsdale, all of Ariz.

[73] Assignee: Motorola, Inc., Schaumburg, Ill.

[21] Appl. No.: 576,531

[22] Filed: Aug. 31, 1990

[51] Int. Cl.⁵ .......................................... H01L 29/26
[52] U.S. Cl. ................................ 257/200; 257/183; 257/499
[58] Field of Search ............... 357/16, 60; 257/178, 257/179, 183, 200, 415, 417, 499

[56] References Cited

U.S. PATENT DOCUMENTS

| | | | |
|---|---|---|---|
| 3,935,040 | 1/1976 | Mason | 357/16 |
| 4,632,712 | 12/1986 | Fan et al. | 357/60 |
| 4,639,277 | 1/1987 | Hawkins | 357/59 |
| 4,717,681 | 1/1988 | Curran | 357/67 |
| 4,845,044 | 7/1989 | Ariyoshi et al. | 357/16 |
| 4,891,329 | 1/1990 | Reisman et al. | 437/132 |
| 4,928,154 | 5/1990 | Umeno et al. | 357/60 |
| 4,963,949 | 10/1990 | Wanlass et al. | 357/16 |

Primary Examiner—Sara W. Crane
Attorney, Agent, or Firm—Miriam Jackson; Joe E. Barbee

[57] ABSTRACT

A non-silicon substrate is bonded to a silicon substrate with a stress-relief layer between the non-silicon substrate and the silicon substrate. The stress-relief layer reduces the stress between the non-silicon substrate and the silicon substrate. The stress is created by the difference in the thermal expansion coefficients of the two materials. The stress-relief layer may be a low melting point metal, a semiconductor layer having its thermal expansion coefficient close to the thermal expansion coefficient of the non-silicon substrate. The silicon substrate and/or the non-silicon substrate may have a silicon dioxide layer formed thereon such that the silicon dioxide layer is adjacent to the stress-relief layer.

2 Claims, 2 Drawing Sheets

| MATERIAL | THERMAL EXPANSION COEFFICIENT AROUND RT [/°C] |
|---|---|
| Si | $2.42 \times 10^{-6}$ |
| Ge | $5.92 \times 10^{-6}$ |
| GaAs | $6.86 \times 10^{-6}$ |
| GaP | $5.91 \times 10^{-6}$ |
| InP | $4.56 \times 10^{-6}$ |
| $SiO_2$ | $5.0 \times 10^{-7}$ |

*FIG. 7*

NON-SILICON AND SILICON BONDED STRUCTURE AND METHOD OF MANUFACTURE

BACKGROUND OF THE INVENTION

This invention relates, in general, to semiconductor devices, and more particularly, to a non-silicon and silicon bonded structure and method of manufacture.

It may be desirable to bond a non-silicon substrate to a silicon substrate. Although silicon-to-silicon wafer bonding is well known, the bonding of a silicon substrate to a non-silicon substrate is not as straightforward.

The bonding of a non-silicon substrate, such as gallium arsenide, to a bare silicon substrate or a silicon substrate having a silicon dioxide layer formed thereon has been accomplished. Bonding is accomplished by bringing the substrates together and annealing. The thermal expansion coefficient of gallium arsenide is much larger than that of silicon or silicon dioxide, so that the gallium arsenide expands more during high temperature processing. When the bonded structure is cooled to room temperature, defects are created at the interface between the gallium arsenide substrate and the silicon substrate (or the silicon dioxide layer, if present) due to the stress created by the difference in thermal expansion coefficients of the silicon substrate or the silicon layer and the gallium arsenide substrate. The presence of silicon dioxide between the silicon substrate and the non-silicon substrate may help to reduce some of the stress because it is amorphous. However, it would be desirable to further reduce the stress to further lower the presence of defects.

A way to relieve the stress in a bonded non-silicon and silicon structure has been accomplished by cutting or etching the non-silicon substrate into small pieces after bonding. This, however, is an unduly complicated process. The stress, and thus the number of defects formed, may be lowered by lowering the temperature at which the anneal is done during bonding. However, it may be desirable to use a high temperature anneal to increase the bonding strength between the non-silicon substrate and the silicon substrate or the silicon dioxide. Furthermore, it is necessary to use high temperature processing to form semiconductor devices in the non-silicon substrate after bonding, thus high temperature processing can not be avoided.

By now it should be appreciated that it would be advantageous to provide an improved method of bonding a non-silicon substrate to a silicon substrate and reduce the number of defects formed during high temperature processing.

Accordingly, it is an object of the present invention to provide a stress-free non-silicon and silicon bonded structure and method of manufacture.

Another object of the present invention is to provide an improved method of bonding a non-silicon substrate to a silicon substrate.

A further object of the present invention is to provide an improved non-silicon and silicon bonded structure which can be subjected to high temperature processing without creating defects.

An additional object of the present invention is to provide an improved non-silicon and silicon or quartz bonded structure wherein the silicon or quartz provides an ideal supporting material for the non-silicon substrate.

Yet another object of the present invention is to provide a non-silicon and silicon bonded structure having a stress-relief layer between them.

SUMMARY OF THE INVENTION

In accordance with the present invention, the above and other objects and advantages are provided by bonding a non-silicon substrate to a silicon substrate with a stress-relief layer between the non-silicon substrate and the silicon substrate. The stress-relief layer reduces the stress between the non-silicon substrate and the silicon substrate. The stress is created by the difference in the thermal expansion coefficients of the two materials. The stress-relief layer may be a low melting point metal, a semiconductor layer having its thermal expansion coefficient close to the thermal expansion coefficient of the non-silicon substrate. The silicon substrate and/or the non-silicon substrate may have a silicon dioxide layer formed thereon such that the silicon dioxide layer is adjacent to the stress-relief layer.

BRIEF DESCRIPTION OF THE DRAWINGS

FIG. 7 illustrates a table of thermal expansion coefficients of various materials.

DETAILED DESCRIPTION OF THE DRAWINGS

Figure 1:
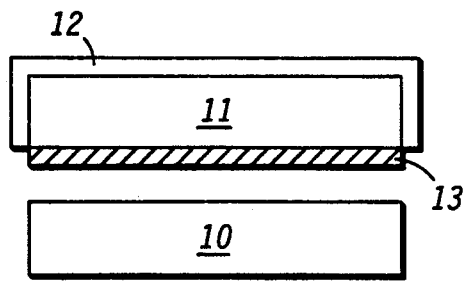
FIGS. 1 and 2 illustrate enlarged, cross-sectional views of a first embodiment of the present invention in various stages of fabrication.
Figure 2:
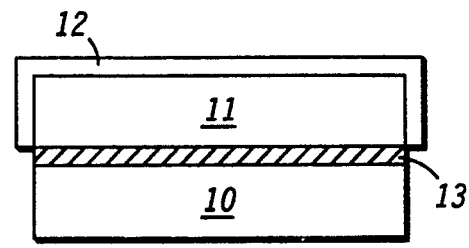

FIGS. 1 and 2 illustrate enlarged, cross-sectional views of a first embodiment of the present invention in various stages of fabrication. What is illustrated in FIG. 1 is a silicon substrate 10, a non-silicon substrate 11 having a capping layer 12 on a top and on side surfaces, and a stress-relief layer 13 formed on a bottom surface. In a preferred embodiment, non-silicon substrate 11 is comprised of a III-V semiconductor material. Gallium arsenide is the most commonly used III-V semiconductor material. However, non-silicon substrate 11 may also be comprised of other materials, such as a silicon dioxide monocrystalline quartz layer. Silicon substrate 10 may be comprised of non-single crystal silicon, polysilicon or even a quartz. Capping layer 12 is a silicon nitride layer, or the like, and is formed by standard processing techniques well known in the art. In general, stress-relief layer 13 is a material that relieves the stress between non-silicon substrate 11 and silicon substrate 10. In the first embodiment, stress-relief layer 13 is comprised of a low melting point metal, such as an alloy of gallium and arsenide, gallium, indium, and the like. A low melting point metal is defined in the present invention as a metal having a melting point below approximately 800° C. The low melting point metal may be formed in various ways.

If, for example, non-silicon substrate 11 is comprised of gallium arsenide, then a way of forming the low melting point metal is formed by subjecting non-silicon substrate 11 to a temperature at which arsenic outgases from the un-capped surfaces of the gallium arsenide.

This results in a thin layer of an alloy gallium and arsenic 13 left at the uncapped surface of the gallium arsenide substrate. It is also possible to form a thin layer of an alloy of gallium and arsenic 13 on all surfaces (not shown) of the gallium arsenide substrate by not forming capping layer 12.

FIG. 2 illustrates the structures of FIG. 1 further along in the process. Non-silicon substrate 11 and silicon substrate 10 are brought together, with stress-relief layer 13, the low melting point metal layer, positioned between them, and then annealed at a predetermined temperature. When the low melting point metal layer melts during the anneal, it allows non-silicon substrate 11 to expand during the anneal and contract when cooled. Thus, the stress between non-silicon substrate 11 and silicon substrate 10 is relieved during high temperature processing. Capping layer 12 may be removed thereafter. Bonding by electrostatic means, which is well known in the art, may also be used.

Figure 3:
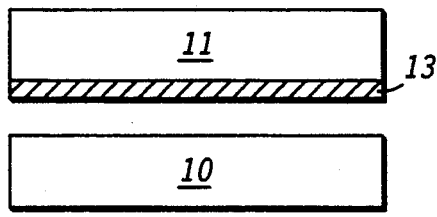
FIGS. 3 and 4 illustrate enlarged, cross-sectional views of a second embodiment of the present invention in various stages of fabrication.
Figure 4:
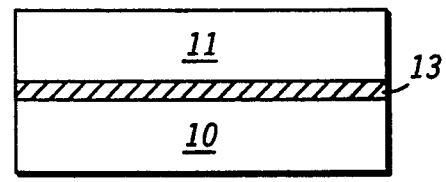

FIGS. 3 and 4 illustrate enlarged, cross-sectional views of a second embodiment of the present invention in various stages of fabrication. The layers in FIG. 3 are the same as in FIG. 1, except that stress-relief layer 13 in this embodiment is formed by evaporating or sputtering it onto one surface of non-silicon substrate 11. Capping layer 12 (shown in FIG. 1) is not needed in this embodiment. Note also that the low melting point metal may be evaporated or sputtered onto silicon substrate 10, rather than non-silicon substrate 11.

FIG. 4 illustrates the bonded structure, which can be formed as explained above with reference to FIG. 2.

Figure 5:
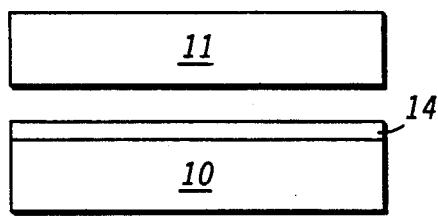
FIGS. 5 and 6 illustrate enlarged, cross-sectional views of a third embodiment of the present invention in various stages of fabrication.
Figure 6:
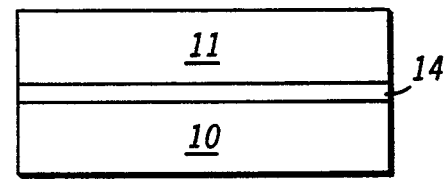

FIGS. 5 and 6 illustrate enlarged, cross-sectional views of a third embodiment of the present invention in various stages of fabrication. The layers in FIG. 5 are the same as in FIG. 3, except that a stress-relief layer 14 in this embodiment is a semiconductor stress-relief layer 14 which has a thermal expansion coefficient close to the thermal expansion coefficient of non-silicon substrate 11. A thermal expansion coefficient which is close to the thermal expansion coefficient of the non-silicon semiconductor is one that is preferably within approximately 25-35% of that value. The semiconductor tress-relief layer 14 here can be a germanium layer, a gallium arsenide layer, a gallium phosphide layer, an indium phosphide layer, a silicon-germanium layer, or a graded silicon-germanium layer which is graded so that silicon is adjacent to silicon substrate 10 and germanium is adjacent to non-silicon substrate 11. The graded silicon-germanium layer 14 may be either linearly graded or non-linearly graded.

FIG. 6 illustrates the structures of FIG. 5 further along in the process. Non-silicon substrate 11 and silicon substrate 10 are brought together with stress-relief layer 14, the semiconductor stress-relief layer, positioned between them, and then annealed at a predetermined temperature. Stress-relief layer 14 expands and contracts in a closer magnitude with non-silicon substrate 11 than with silicon substrate 10 during the anneal, thus the major stress is confined to the interface between silicon substrate 10 and stress-relief layer 14 rather than the interface between non-silicon substrate 11 and stress-relief layer 14. Note also that stress-relief layer 14 can be formed on non-silicon substrate 11.

FIG. 7 illustrates a table of thermal expansion coefficients of various materials. FIG. 7 is only intended to point out the differences in the thermal expansion coefficients of a non-silicon substrate 11, such as gallium arsenide, and silicon substrate 10; and suitable semiconductor stress-relief layers, such as germanium. Silicon dioxide has a thermal expansion coefficient which is not close to silicon or gallium arsenide. Silicon dioxide, however, may be able to relieve small amounts of stress because it is amorphous. FIG. 7 is not intended to limit the use of other possible suitable stress-relief layers.

In one example, stress-relief layer 14 is a germanium layer. When the germanium layer is grown on the surface of silicon substrate 10, misfit dislocations (not shown) are formed in a plane at the interface of the germanium layer and silicon substrate 10 due to the difference of lattice constants of silicon and germanium. These misfit dislocations allow for slip at the interface between the germanium and silicon substrate 10, which relieves further stress.

Figure 8:
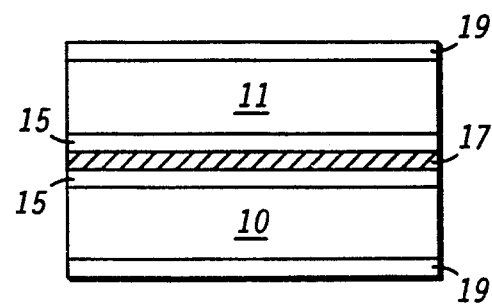
FIG. 8 illustrates an enlarged, cross-sectional view of a fourth embodiment of the present invention.

FIG. 8 illustrates an enlarged, cross-sectional view of a fourth embodiment of the present invention. What is shown is a silicon substrate 10 having a silicon dioxide layer 15 formed on the surface to be bonded and a silicon dioxide layer 19 on the opposite surface that is not bonded, a non-silicon substrate 11 having a silicon dioxide layer 15 formed on the surface to be bonded and a silicon dioxide layer 19 on the opposite surface that is not bonded, and a stress-relief layer 17 sandwiched between silicon dioxide layers 15. Silicon dioxide layers 19 prevent substrates 10 and 11 from bowing. Stress-relief layer 17 may be comprised of a low melting point metal layer or a semiconductor stress-relief layer as disclosed with reference to FIGS. 1 through 4. Note that stress-relief layer 17 may be formed on either silicon dioxide layer 15 before bonding. Bonding is accomplished in the same manner as described with reference to FIGS. 1 and 2. Silicon dioxide layers 15 which are bonded may enhance the adhesion to stress-relief layer 17, especially if it is a low melting point metal. It may be desirable to fabricate a structure having only one silicon dioxide layer 15 formed on either silicon substrate 10 or non-silicon substrate 11. These structures provide for semiconductor on insulator structures.

By now it should be appreciated that there has been provided a non-silicon to silicon bonded structure having a stress-relief layer which reduces the stress between silicon and non-silicon substrates. The reduction in stress eliminates or reduces the defects generated during the bonding anneal cycle or during any subsequent high temperature processing.

We claim:
1. A structure, comprising:
   a first self-supporting structure comprised of a silicon substrate;
   a stress-relief layer disposed on the first self-supporting structure; and
   a second self-supporting structure comprised of a non-silicon semiconductor substrate disposed on the stress-relief layer, wherein the stress-relief layer is comprised of a semiconductor layer having a thermal expansion coefficient close to the thermal expansion coefficient of the non-silicon semiconductor substrate and wherein the second self-supporting structure is further comprised of an oxide layer disposed between the non-silicon semiconductor substrate and the stress-relief layer.

2. A structure, comprising:
   a first self-supporting structure comprised of a silicon substrate;
   a stress-relief layer disposed on the first self-supporting structure; and a second self-supporting structure comprised of a non-silicon semiconductor substrate disposed on the stress-relief layer, wherein the stress relief layer is comprised of a metal layer having a low melting point and wherein the second self-supporting structure is further comprised of an oxide layer disposed between the non-silicon semiconductor substrate and the stress-relief layer.

* * * * *